United States Patent [19]
Weggel

[11] Patent Number: 5,646,837
[45] Date of Patent: Jul. 8, 1997

[54] PULSE-WIDTH MODULATED CIRCUIT WITH IMPROVED LINEARITY

[75] Inventor: Craig R. Weggel, Willow Grove, Pa.

[73] Assignee: Performance Controls, Inc., Horsham, Pa.

[21] Appl. No.: 575,063

[22] Filed: Dec. 19, 1995

[51] Int. Cl.6 .................................................. H02H 7/122
[52] U.S. Cl. .......................................... 363/124; 363/58
[58] Field of Search ............................. 363/41, 58, 98, 363/123, 132, 136, 124, 16, 267, 282, 290, 351; 318/599; 388/811, 907.2

[56] References Cited

U.S. PATENT DOCUMENTS

| | | | |
|---|---|---|---|
| 4,594,650 | 6/1986 | Kinbara | 363/58 |
| 4,916,599 | 4/1990 | Traxler et al. | 363/65 |
| 4,975,823 | 12/1990 | Rilly et al. | 363/56 |
| 5,070,292 | 12/1991 | Goff | 318/811 |
| 5,081,409 | 1/1992 | Goff | 318/811 |
| 5,122,728 | 6/1992 | Ashley | 323/382 |
| 5,179,512 | 1/1993 | Fisher et al. | 353/127 |
| 5,365,422 | 11/1994 | Close et al. | 363/98 |
| 5,379,209 | 1/1995 | Goff | 318/811 |

*Primary Examiner*—Aditya Krishnan
*Attorney, Agent, or Firm*—William H. Eilberg

[57] ABSTRACT

A pulse-width modulated (PWM) circuit applies voltage to a load with high fidelity. The circuit includes switches connected in series with inductors, the inductors being magnetically coupled to other inductors connected to the gates of the switches. The arrangement of inductors and the magnetic coupling causes the turn-on of one switch to assist in the turn-off of the other switch. A pair of diodes connected across some of the inductors assures that the magnetically coupled inductors do not assist the switches to turn on. The result is a circuit which effectively eliminates the problem of "shoot through" current, without providing a "dead time" in the switching scheme, and thus without substantial power losses. The circuit can therefore be used in audio amplification, and in other applications requiring high fidelity.

13 Claims, 1 Drawing Sheet

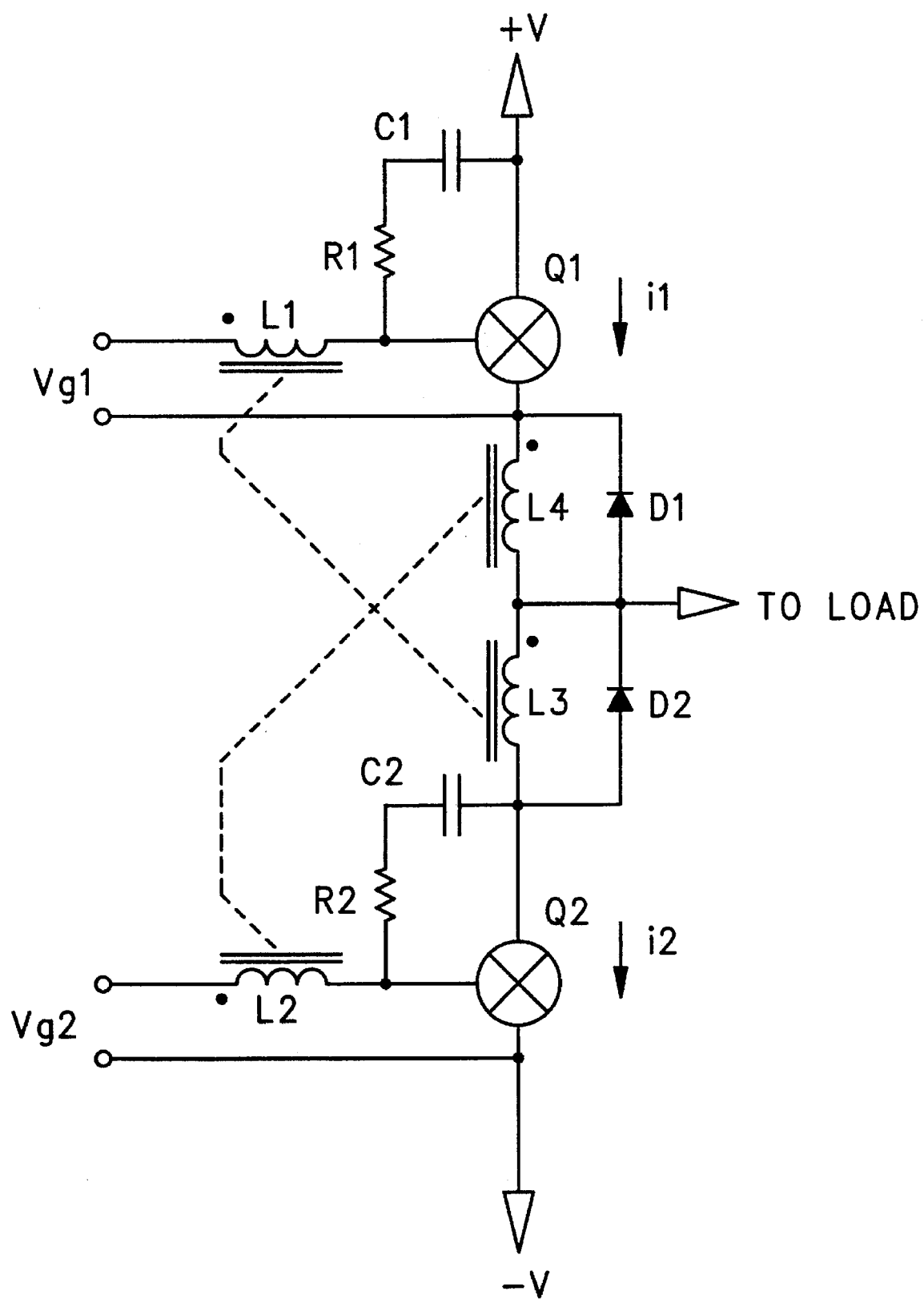

PULSE-WIDTH MODULATED CIRCUIT WITH IMPROVED LINEARITY

BACKGROUND OF THE INVENTION

This invention relates to the field of pulse-width-modulated (PWM) circuits, and provides a circuit for applying a voltage, and thereby a current, to a load, wherein the waveform representing the current flowing through the load is substantially free of distortion.

Examples of PWM circuits are shown in U.S. Pat. Nos. 5,070,292, 5,081,409, 5,379,209, and 5,365,422. The disclosures of all of the latter patents are hereby incorporated by reference into this specification. These patents give examples of circuits in which a series of pulses controls a set of electronic switches which selectively connect a power supply to a load. The load can be an electric motor, or a coil used to produce a magnetic field, or some other load. PWM circuits often have the form of an H-bridge, which comprises four switches, arranged symmetrically around the load, the switches providing the desired paths between a power supply and the load.

In theory, at any given instant, two of the four switches of an H-bridge are "on" and the other two switches are "off", and the currents flow exactly in the desired paths. In practice, the switches are not ideal, and their states cannot be changed instantaneously. In fact, each switch contains a parasitic diode, formed by the source and drain of a field effect transistor, for example, and this parasitic diode can conduct current in the reverse direction, regardless of whether the switch is "on" or "off". Furthermore, when the diode has been conducting, it takes a finite amount of time to stop conducting (i.e. to turn "off"). Due to these non-ideal properties of the switches, there are moments at which current may flow, with little or no resistance, from the power supply, through two switches (bypassing the load) and back to the power supply, creating a momentary short circuit. This condition is known as "cross-conduction", and the current is known as "shoot through" current. In the case of diode recovery, the condition is known as "recovery current".

Prior art circuits have overcome the problem of shoot through current by providing a "dead time" in the PWM circuit. That is, the switch that would otherwise cause a momentary short circuit is prevented from closing by delaying the arrival of a leading edge of a pulse. However, such artificial dead time introduces considerable non-linearity into the system. The waveform of the current flowing through the load becomes distorted, and the result is unsuitable for applications requiring high fidelity, such as audio amplification.

The present invention provides an improved PWM circuit in which the current flowing through the load is substantially undistorted, but in which the problem of shoot through current is reduced or eliminated.

SUMMARY OF THE INVENTION

The preferred embodiment of the invention comprises a pair of electronic switches, the gates of the switches being connected to receive control pulses. A power supply is connected across the drain of the first switch and the source of the second switch. The source of the first switch is connected to a first inductor, and the drain of the second switch is connected to a second inductor. The first and second inductors are connected at a junction, the junction being connected to a load. Third and fourth inductors are connected, respectively, to the gates of the first and second switches. The inductors are positioned such that the first and fourth inductors are magnetically coupled, and the second and third inductors are also magnetically coupled. The circuit also includes diodes connected in parallel with both of the first and second inductors.

The magnetic coupling of inductors is such that currents flowing through the source or drain of one of the switches affect the voltage applied to the gate of the opposite switch. The result is that a switch that would otherwise be conducting, inappropriately, is helped to turn off due to the magnetic coupling of the inductors. The diodes connected across the first and second inductors assure that the circuit assists in the turn-off of switches, but that it does not assist in their turn-on. The circuit of the present invention therefore automatically nullifies any tendency to produce shoot through current, without requiring the provision of dead time in the switching scheme, and without requiring the use of large inductors to limit the rate of change of diode recovery current.

The invention therefore has the primary object of providing a pulse-width modulated (PWM) circuit for applying current to a load.

The invention has the further object of providing a PWM circuit wherein the response of the circuit is very linear, and wherein it is not necessary to include a dead time in the operation of the circuit.

The invention has the further object of providing an inexpensive PWM circuit for applying current to a load, especially for applications requiring high fidelity.

The invention has the further object of providing a PWM circuit which is suitable for use in audio amplification and other applications requiring a high degree of linearity.

The reader skilled in the art will recognize other objects and advantages of the present invention, from a reading of the brief description of the drawing, the detailed description of the invention, and the appended claims.

BRIEF DESCRIPTION OF THE DRAWING

The Figure provides a schematic diagram of a circuit constructed according to the present invention.

DETAILED DESCRIPTION OF THE INVENTION

The Figure shows a schematic diagram illustrating the present invention. The Figure shows two electronic switches, Q1 and Q2, which are connected to a load (not explicitly shown in the Figure), as indicated by an arrow. The circuit shown in the Figure therefore comprises one-half of an H-bridge. It is understood that another pair of switches could be provided on the other side of the load, to provide a complete H-bridge, thereby completing the circuit between the power supply and the load. Still other combinations of switches can be used, within the scope of the invention.

The electronic switches are preferably either FETs or IGBTs, but the invention can be practiced with virtually any kind of electronic switch.

As illustrated in the Figure, a power supply (not explicitly shown but represented by the symbols +V and −V and by arrows indicating a connection) is applied across the series combination of switches Q1 and Q2.

That is, the +V terminal of the power supply is connected to the drain of Q1, and the −V terminal of the power supply is connected to the source of Q2. Gate signals $V_{g1}$ and $V_{g2}$ are applied to the gates of switches Q1 and Q2, respectively. These gate signals comprise trains of pulses which represent the voltage to be applied to the load. Such pulses are generated in a conventional PWM system, as explained, for example, in one or more of the patents cited above.

Inductors L1 and L2 are connected in series with the gates of Q1 and Q2, respectively. Inductors L3 and L4 are connected in series with each other at a junction, the junction being directly connected to the load. The other end of inductor L3 is connected to the drain of switch Q2, and the other end of inductor L4 is connected to the source of switch Q1. Inductors L1 and L3 are magnetically coupled. Inductors L2 and L4 are also magnetically coupled. The magnetic coupling is indicated by the dotted lines in the Figure, and the relative sign of the coupling is indicated by the heavy dots located adjacent each inductor. Diodes D1 and D2 are connected in series with each other, and in parallel with inductors L4 and L3, respectively.

Capacitor C1 and resistor R1 are connected in series with each other, between the gate and drain of switch Q1. Capacitor C2 and resistor R2 are connected in series with each other, between the gate and drain of switch Q2.

Typical values for T1, which is the transformer defined by L1 and L3, are at least about 15 volt-usec. A similar value applies to T2, the transformer defined by L2 and L4. The winding inductance of L1–L4 can be in the range of 0.1–10 uH. Capacitors C1 and C2 may be in the range of 100–500 pF, and resistors R1 and R2 may be in the range of 10–100 ohms. These values are given only as examples, and should not be deemed to limit the scope of the invention.

The operation of the circuit shown in the Figure can be described with respect to the following cases.

In a PWM circuit, the pulses applied to the gates of Q1 and Q2 will normally be mutually complementary, so that only one of Q1 or Q2 should be on at one time. But in actuality, there are brief instants at which the switching does not operate according to theory. For example, suppose that Q2 turns on before Q1 turns off. Cross-conduction will begin to occur. That is, current will flow from +V to –V, and the combination of switches Q1 and Q2 will momentarily appear as a short circuit. But L3 and L4 will immediately be exposed to a positive di/dt, producing a positive voltage across L1 and L2, due to the magnetic coupling. The effective voltages seen at the gates of Q1 and Q2 will be reduced by the voltages across L1 and L2, respectively. Thus, both Q1 and Q2 will be induced by L1 and L2 to turn off (or to enter the linear region, yielding a higher impedance) when cross-conduction begins to occur. The same result occurs when Q1 turns on before Q2 turns off, due to the symmetry of the circuit. The circuit is therefore inherently self-limiting, and a serious cross-conduction condition never develops.

Now consider the cases in which one of the switches is acting as a switch (a transistor) while the other switch is acting as a diode. It is well known that an electronic switch inherently includes a parasitic diode, or a "free wheeling" diode, as is explained more fully in U.S. Pat. No. 5,379,209, cited above. A parasitic diode can be visualized as if it were connected from source to drain of the switch. Now suppose that Q1 is acting as a transistor. Current is flowing from +V, through inductor L4, and to the load. As $V_{g1}$ is driven below the gate threshold voltage, the current flowing through Q1 begins to decrease (i.e. there is a negative di/dt). The current flowing through Q2 and L3 begins to increase (i.e. there is a positive di/dt), due to current flow through the parasitic diode of Q2. This positive di/dt through L3 produces a positive voltage across L1 which, in turn, assists the turn-off of Q1. However, due to diode D1 connected in parallel with L4, the negative di/dt will not produce a negative voltage across L2, and therefore will not assist in the turn-on of Q2. Thus, the circuit assists in the turn-off of switches, but never assists in turning them on. As long as L4 is not exposed to a positive di/dt, switch Q2 will operate unaffected by the special features of the circuit.

Now consider the case in which Q1 is acting as a diode, and Q2 is turned off. Current is flowing from the load, through L4 and its diode D1, to +V, through the parasitic diode of Q1. As the difference between $V_{g2}$ and $V_{L2}$ exceeds the gate threshold voltage level, Q2 will begin to "steal" current from Q1. If the parasitic diode were ideal, L4 would be exposed to a negative di/dt and L3 would see a positive di/dt. However, the diode in Q1 does not turn off immediately; instead, L3 and L4 are both exposed to a positive di/dt. This event forces both Q1 and Q2 to turn off. Since Q2 is being commanded to turn on, a voltage is developed across L2, this voltage being equal to the difference between the maximum gate voltage, as determined by the gate driver circuit, and the threshold gate voltage, this voltage being sufficient to extinguish cross-conduction. Since Q1 is being commanded to turn off, the voltage developed across L1 merely accelerates the turn-off of Q1. In order to maintain the voltage across L2, L4 must be exposed to a di/dt whose value is $V_{g2max} - V_{threshold}$ divided by the inductance of L4. This di/dt will be maintained until the stored charge in the parasitic diode has been recovered. Once the diode is recovered, the di/dt as seen by L4 will change signs, and Q2 will be allowed to be fully enhanced, completing the switching cycle. The circuit, by nature, regulates the rate of change of current (di/dt) while recovering charge in either parasitic (or free wheeling) diode. This helps to reduce power dissipation, as well as to reduce electromagnetic emissions (EMI), due to diode recovery. The latter is achieved by limiting di/dt and thereby limiting the amount of stored charge to be recovered.

The components R1, C1, R2, and C2 comprise an active snubber circuit. These components control the rate of change of voltage (dv/dt). If a positive dv/dt (increasing voltage) exists across Q1, a current flows through C1. If the dv/dt is high enough, the current flowing through C1 will exceed the gate driver circuit's maximum output current, resulting in a net current flowing into the gate. It follows that the gate voltage will increase, as charge is being put into the gate, crossing the gate threshold voltage of Q1. This action causes Q1 to turn on and reduce the rate of change of voltage across Q1. Likewise, when dv/dt is negative (decreasing voltage), charge is pulled from the gate, turning Q1 off, and thereby reducing the rate of change across Q1 in a negative feedback manner. The resistors R1 and R2 are for current limiting, and enhance the stability of the snubber circuit. A conventional single-capacitor snubber can interact with the circuit shown in the Figure, causing undesirable oscillations. The snubber circuit shown in the Figure provides significant damping, by virtue of the resistive nature of the switch, allowing switching free of spurious oscillations.

The present invention therefore provides a circuit in which distortion is substantially eliminated. A supposedly sinusoidal waveform, produced by a conventional H-bridge, is likely to show distortion where the current crosses through zero. This is due to the "undefined" state of the voltage at the output node (the node connected to the load) during dead time. Neither Q1 nor Q2 is "holding" the output node voltage to either +V or –V. Instead, the direction of the load current dictates what the output voltage will be. For example, suppose current is flowing into the output node. If both Q1 and Q2 are off (an open circuit), the voltage at the output node will rise to one diode-drop above +V. Similarly, if current is flowing out of the output node, the voltage will decrease to one diode-drop below -V. Therefore, for the short period during dead time, the output voltage is free to find either of the two states as determined by the direction of the load current. By eliminating the dead time, the output voltage is always defined by the control circuitry. The result is less distortion in the voltage waveform, yielding less distortion in the current waveform. The current output waveform of a bridge using the circuit of the present invention is virtually distortion-free.

The present invention is therefore particularly useful in applications requiring high linearity, such as in audio amplification. The invention still makes it feasible to use a switching amplifier, in such an application, without increased power dissipation due to switching transients.

The circuit of the present invention can be modified. As noted above, the circuit can be implemented with a full H-bridge, and is not limited to the half-bridge arrangement shown in the Figure. Different kinds of electronic switches can be used. The invention is not limited by the manner in which the control pulses are generated. The diodes D1 and D2 could be eliminated, in which case the magnetic coupling of inductors would still avoid the cross-conduction problem, but in this case the power losses would increase, due to increased switching time. These and other modifications should be considered within the spirit and scope of the following claims.

What is claimed is:

1. A pulse-width modulated (PWM) circuit for applying current to a load, the PWM circuit including at least one pair of switches, the switches being connected in series, both switches having source, gate, and drain terminals, the switches being connected to a power supply and to the load, the switches being controlled by control pulses applied to the gate terminals, the circuit further comprising a first inductor connected in series with one of said first and second switches, and a second inductor connected to the gate terminal of another of said first and second switches, wherein said first and second inductors are magnetically coupled.

2. The circuit of claim 1, wherein there are two inductors connected in series with said first and second switches, and wherein there are inductors connected to the gate terminals of both of said first and second switches, and wherein each inductor connected to a given switch is magnetically coupled to an inductor connected to the gate terminal of another switch.

3. The circuit of claim 2, further comprising diodes connected in parallel with the inductors which are connected in series with the switches.

4. The circuit of claim 1, further comprising a diode connected in parallel with said first inductor.

5. The circuit of claim 1, further comprising a resistor and a capacitor connected series between the gate and drain of at least one of the switches.

6. The circuit of claim 1, further comprising a resistor and a capacitor connected series between the gate and drain of both of the switches.

7. A pulse-width modulated (PWM) circuit for applying current to a load, the circuit comprising:
 a) a first switch having a source, gate, and drain, the drain of the first switch being connected to a power supply, the gate of the first switch being connected to receive a control signal, the source of the first switch being connected to a first inductor,
 b) a second switch having a source, gate, and drain, the source of the second switch being connected to the power supply, the gate of the second switch being connected to receive a control signal, the drain of the second switch being connected to a second inductor,
 c) the first and second inductors being connected together at a junction, the junction being connected to the load,
 d) a third inductor connected to the gate of the first switch,
 e) a fourth inductor connected to the gate of the second switch,
 f) the first inductor being magnetically coupled to the fourth inductor,
 g) the second inductor being magnetically coupled to the third inductor.

8. The circuit of claim 7, further comprising diodes connected in parallel with both of the first and second inductors.

9. The circuit of claim 7, further comprising a resistor and a capacitor connected series between the gate and drain of at least one of the switches.

10. The circuit of claim 7, further comprising a resistor and a capacitor connected series between the gate and drain of both of the first and second switches.

11. A pulse-width modulated (PWM) circuit for applying current to a load, the PWM circuit including at least one pair of switches connected in series, the switches having source, gate, and drain terminals, the circuit further comprising means for providing feedback between a source or drain of one switch and a gate of another switch, the feedback providing means comprising means for turning one switch off when another switch is on, wherein the feedback providing means comprises at least one pair of magnetically coupled inductors, one inductor of said at least one pair being connected to the gate terminal of one switch, and another inductor of said at least one pair being connected to a source or drain of another switch.

12. The circuit of claim 11, wherein the feedback providing means comprises means for turning a switch off without turning another switch on.

13. The circuit of claim 12, wherein the means for turning a switch off without turning another switch on comprises at least one diode connected in parallel with one of the switches.

* * * * *